United States Patent [19]

Chittipeddi et al.

[11] Patent Number: 5,045,486
[45] Date of Patent: Sep. 3, 1991

[54] TRANSISTOR FABRICATION METHOD

[75] Inventors: Sailesh Chittipeddi, Whitehall; William T. Cochran, New Tripoli; Michael J. Kelly, Orefield, all of Pa.

[73] Assignee: AT&T Bell Laboratories, Murray Hill, N.J.

[21] Appl. No.: 543,592

[22] Filed: Jun. 26, 1990

[51] Int. Cl.[5] ........................................... H01L 21/265
[52] U.S. Cl. ........................................ 437/41; 437/40; 437/29; 437/913
[58] Field of Search .................. 437/41, 984, 913, 40, 437/29, 44; 148/DIG. 53

[56] References Cited

U.S. PATENT DOCUMENTS

| 4,382,827 | 5/1983 | Romano-Moran et al. | 437/44 |
| 4,616,399 | 10/1986 | Ooka | 437/29 |
| 4,728,617 | 3/1988 | Woo et al. | 437/44 |
| 4,818,714 | 4/1989 | Haskell | 437/44 |
| 4,874,713 | 10/1989 | Gioia | 437/41 |

FOREIGN PATENT DOCUMENTS

| 53-78181 | 7/1978 | Japan | 437/40 |
| 0108380 | 9/1978 | Japan | 437/40 |
| 0193061 | 11/1984 | Japan | 437/29 |
| 0045071 | 2/1987 | Japan | 437/41 |
| 0078181 | 7/1987 | Japan | 437/40 |
| 0241376 | 11/1987 | Japan | 437/40 |

OTHER PUBLICATIONS

"Channeling of Implanted Phosphorus Through Polycrystalline Silicon," T. E. Seidel, Appl. Phys. Lett. vol. 36, No. 6, Mar. 15, 1980, pp. 447–449.
"Arsenic Ion Channeling Through Single Crystal Silicon," Y. Wada et al., J. Electrochem. Soc.: Solid-State Science and Technology, Jan. 1980, pp. 206–210.

Primary Examiner—Brian E. Hearn
Assistant Examiner—Michael Trinh
Attorney, Agent, or Firm—John T. Rehberg

[57] ABSTRACT

A method of forming a transistor is disclosed. Conventional fabrication techniques direct an ion implantation beam toward a substrate upon which a gate has already been formed. If the gate stack is too low relative to the incident beam energy, the dopant species may channel thorugh the gate stack, adversely affecting transistor performance. The present invention prevents channeling through this gate by covering the gate with a protective layer before ion implantation.

2 Claims, 2 Drawing Sheets

TRANSISTOR FABRICATION METHOD

TECHNICAL FIELD

This invention relates to semiconductor integrated circuits and to methods for their fabrication.

BACKGROUND OF THE INVENTION

Semiconductor integrated circuits are often fabricated by creating raised topographic features upon a substrate. Then a dopant species is introduced into the substrate with the raised topographic feature serving to mask a portion of the substrate.

For example, in the fabrication of semiconductor integrated circuits using field effect transistors (FETs), a gate stack (typically including a gate oxide with an overlying body of polysilicon) is formed upon a silicon substrate. Then a dopant species is introduced into the silicon substrate by diffusion or ion implantation to create the source and drain regions on both sides of the gate stack. As the dopant species is introduced, the gate stack serves as a self-aligned mask shielding the channel under the gate from the dopant species.

Of course, during the above-described dopant introduction, the gate stack is subjected to the same environment as that to which the to-be-formed source and drain regions are subjected. For example, if ion implantation techniques are employed to create the source and drain, the gate stack is exposed to ion implantation of the same dopant species as the to-be-formed source and drain regions.

In the past, exposure of the gate stack to ion implantation species has not generally created a problem because the implanted species have been completely absorbed by the gate polysilicon. However, as integrated circuit geometries continue to shrink, the thickness of gate stacks also shrink. If the thickness of the gate is too low relative to the implant dose energy, the implanted species may penetrate through the gate.

Penetration of the implanted species through the gate is often termed "channeling." If the energy of the implanted species is great enough and the polysilicon grains are oriented with the direction of the implant species, then the range of implanted species becomes greater than the thickness of the gate stack, and the implanted species may arrive at the gate oxide-silicon interface with enough energy to penetrate into or perhaps through the gate oxide. Thus, channeling depends upon the size and orientations of the polysilicon as well as the energy of the implant species. A single large grain, if oriented parallel to the implant direction can permit channeling.

When channeling occurs, the silicon surface beneath the gate may be inverted, leading to transistor leakage and/or shifts in the threshold voltage. In addition, channeling may cause flatband voltage shifts in polysilicon capacitors. Heretofore the channeling problem has not posed a serious obstacle to integrated circuit designers because gate stacks in previous generation integrated circuits have been thick enough to prevent channeling.

SUMMARY OF THE INVENTION

An illustrative embodiment of the present invention includes:

forming a gate stack upon a portion of a semiconductor substrate, the gate stack having an overlying layer; and forming source and drain regions by exposing the substrate to dopant species with the overlying layer serving to at least partially shield the gate stack and the portion of the substrate beneath the gate stack.

Thus, illustratively, the overlying layer, by helping to prevent channeling, helps to prevent the undesirable voltage shifts mentioned above.

DETAILED DESCRIPTION

Figure 1:
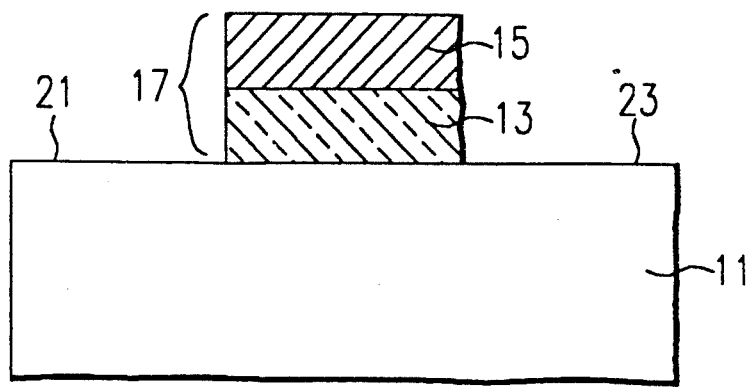
FIGS. 1-5 are cross-sectional views presenting illustrative embodiments of the present invention.
Figure 2:
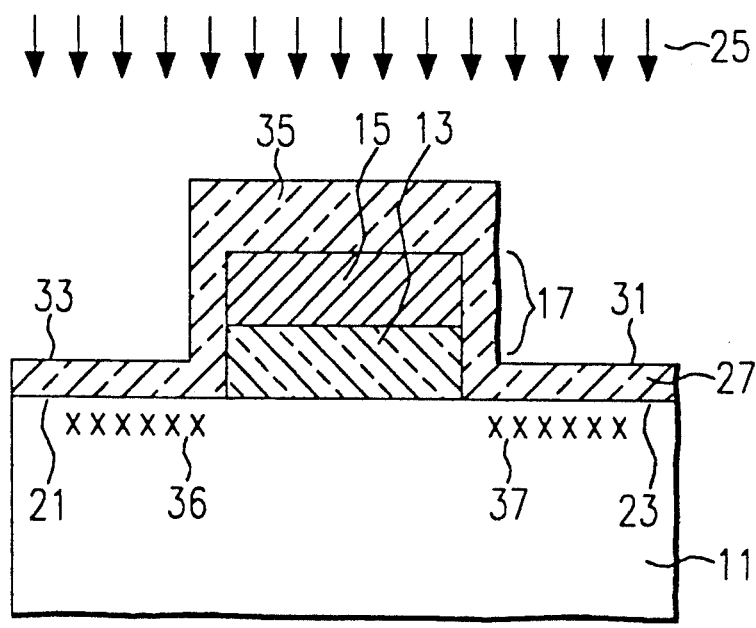

An illustrative embodiment of the present invention is shown in FIGS. 1 and 2. Turning to FIG. 1, there is shown substrate 11 with gate stack 17 including gate oxide 13 and doped polysilicon conductor 15. In FIG. 1 the photoresist employed to pattern gate 17 has already been removed and no ion implantation or other step intended to introduce dopant species into surfaces 21 and 23 for the purpose of forming a source or drain has yet been performed.

Next, turning to FIG. 2, an oxidation step is performed to create thermal oxide layer 27. Layer 27 may be performed, for example, by dry oxidation at a temperature of 800° C. for a time of approximately 20 minutes. A variety of other combinations of time, temperature and atmosphere may be employed by those skilled in the art. The oxidation process produces layer 27 which is thicker over doped polysilicon conductor 15 than over silicon surfaces 21 and 23. The tendency of thermally grown oxide to form a thicker layer upon a doped polysilicon (or amorphous silicon) surface than upon a crystalline silicon surface is called "differential oxidation." Thus, referring to FIG. 2, the thickness of layer 27 above conductor 15, denoted by reference numeral 35, may be approximately 120 Å, whereas the thickness of layer 27 above silicon regions 21 and 23 denoted by reference numerals 33 and 31, respectively, may be approximately 55 Å.

In fairly general terms, differential oxidation depends at least partially upon the difference in dopant concentration between the polysilicon and the crystalline silicon—a greater concentration difference producing a greater oxide thickness difference (the higher concentration having the greater thickness). Furthermore, at least for the temperature range presently investigated by applicants (about 800° C.–950° C.), a lower oxidation temperature produces a greater oxide thickness difference. Thus, as can be appreciated from viewing FIG. 2, a comparatively thick protective layer 35 has been created over polysilicon gate 15. By contrast, a thinner layer denoted by reference numerals 33 and 31 has been created over silicon surfaces 21 and 23, respectively.

After gate 17 has been protected by the creation of oxide layer 35, dopant species may be directed toward substrate 11 to create source and drain regions. In FIG. 2, dopant species 25 are directed by ion implantation means (not shown) toward surfaces 21 and 23 through oxide layers 33 and 31, respectively. (The thickness of layers 33 and 31 is small enough to permit penetration.) Meanwhile, oxide 35 is thick enough to protect gate stack 17 from the aforementioned channeling phenomenon. Implanted species denoted by reference numerals 36 and 37 subsequently contribute to form source and drain of a transistor.

Layer 27 having relatively thin oxide portions 31 and 33 and thicker oxide portion 35 generally need not be removed after the formation of source and drain regions. In those semiconductor fabrication processes which utilize multiple ion implantation steps (such as lightly doped drain processes), layer 35, if left in place, may serve to protect gate stack 17 from channeling during each implantation.

The invention possesses several other advantages besides those enumerated above. In particular, the invention, by protecting the gate stack during ion implantation, helps to protect gate oxide 13 during the implantation step, thus helping to prevent gate oxide defects.

In addition, the invention enhances the quality of any silicide layers which may later (optionally) be formed upon polysilicon 15 (subsequent to removal, of course, of oxide thickness 35). The quality of the silicide layer is enhanced because oxide layer 35 absorbs much of the dopant species directed at gate stack 17. Should the dopant be, for example boron (for example from $BF_2$) or phosphorous, and should a substantial amount of the dopant be trapped in polysilicon 15, a subsequently-formed silicide layer upon polysilicon 15 may exhibit phase segregation (with an attendant rise in sheet resistance) due to interaction with the dopant, such as boron, in polysilicon 15.

Figure 3:
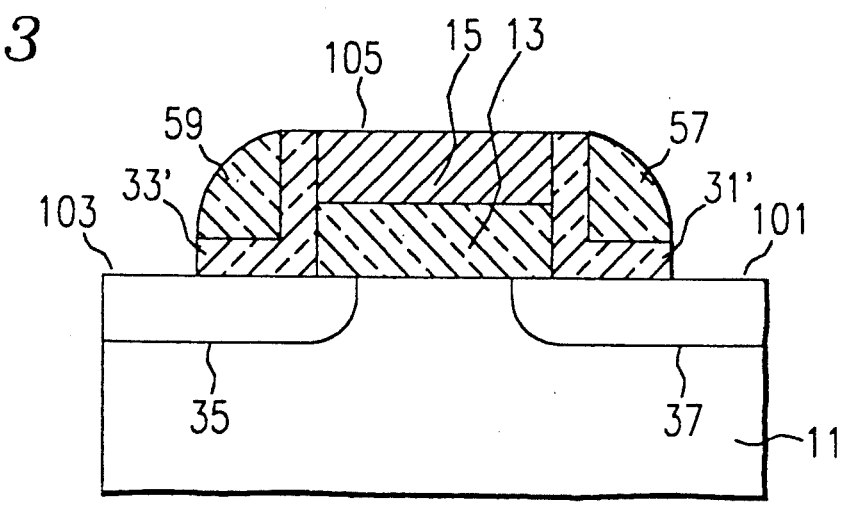

The present invention may be advantageously utilized repeatedly to form lightly-doped drain (LDD) structures. For example, starting from FIG. 2, a thermal drive-in step may be performed to diffuse the implanted dopant species 36 and 37. The drive-in step will typically thicken differential oxide layer 27. As before, oxide layer 27 exhibits a greater thickness in layer 35 above gate stack polysilicon 15 than layers 31 and 33 above silicon substrate 11. Turning to FIG. 3, spacers 59 and 57 are formed, typically by depositing a silicon oxide layer from TEOS or another organometallic precursor and etching the layer anisotropically. The anisotropic etching, if carried far enough (as is typical), will remove all or most of the already-formed differentially oxidized layers except those portions 31', 33' under spacers 59 and 57. Thus, bare silicon surfaces 101 and 103 together with the top 105 of polysilicon gate 15 are again exposed.

Figure 4:
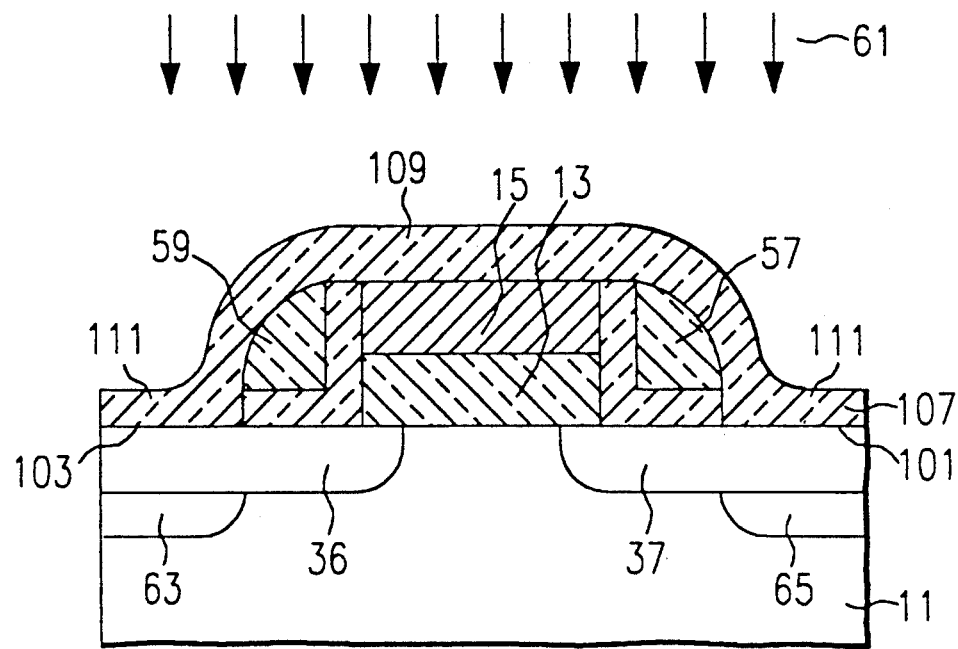

Turning to FIG. 4, another differential oxidation is then performed to create oxide layer 107 with a greater thickness portion 109 over polysilicon 15 than thickness of portion 111 over surfaces 103 and 101. Next, another implantation is performed. Dopant species 61 is directed toward substrate 11, typically by ion implantation, forming doped regions 63 and 65 in the substrate. Oxide thickness portion 109 serves to protect gate stack 17 against channeling. If the dopant species is of opposite type to the initial dopant species in polysilicon 15, then the oxide also prevents counter doping of polysilicon 15. Spacers 59 and 57, of course, serve to partially mask substrate 11 so that the distinctive LDD junction profile containing regions 36 and 63 and regions 37 and 65 is obtained.

The following example provides another illustration of an embodiment of the present invention. This example illustrates several application of the inventive technique to a portion of an LDD CMOS twin-tub process having an n-channel coded gate length of approximately 0.9 μm. First, moats are defined for both a p-tub and an n-tub. A thermally grown gate oxide layer of approximately 150 Å is grown on both tubs. The oxide layer is covered with a polysilicon layer having a thickness of 3800 Å. The polysilicon is phosphorous doped by furnace doping to a resistivity of 75 ohms per square at 900° C. (to enhance gate conductivity). Any oxide created above the polysilicon by furnace doping is stripped to expose the polysilicon. Patterned photoresist is formed above the polysilicon to define gates. Then gates are etched by reactive sputter etching. A sidewall etch is next performed to clean the gate sidewalls. Then a plasma photoresist strip is performed. A 100:1 HF gate sidewall etch is performed.

Next a 5:1 HF clean is performed to remove any residual oxide on the moat surface. Then the first differential oxidation is performed. The wafer is exposed to dry oxygen at 800° C. for 20 minutes. Approximately 55 Å of oxide is grown upon the silicon and approximately 120 Å is grown upon the polysilicon. Then the p-tub lightly doped drain (LDD) implant is performed. A blanket phosphorous implant at 50 KEV, 4E13 is performed to form the p-tub LDD. (In order to save a mask, this phosphorous also goes into the n-tub sources and drains. The n-tub devices will be counter doped later.) Then a thermal drive-in is performed at 900° C. The drive-in step incidentally grows some additional silicon dioxide upon bare silicon and additional silicon dioxide on the polysilicon gate. The p-tub is covered with photoresist. Then a $BF_2$ implant is performed at 50 KEV, 8E14 to counter dope the already implanted phosphorous, thus forming the p-channel LDD in the n-tub. Then the photoresist is removed from the p-tub, a clean is performed, and TEOS spacers are formed adjacent to both the n and p tub gates. The initial differential oxide is removed as a consequence of the etch which forms the TEOS spacer. A new differential oxide layer is grown at 850° C. for 45 minutes in dry oxygen, producing approximately 245 Å above the gates and approximately 125 Å above the source/drain regions adjacent the spacers. The n tub is then covered with photoresist. Then arsenic is implanted at 100 KEV, 3E15. Photoresist is removed from the n tub; the p tub is then covered with photoresist. Then a $BF_2$ source/drain implant is performed over the n tub at 50 KEV, 5E15 to create an n-tub source/drain. The photoresist is then removed. The process thereby produces an LDD structure in both the p tub and the n tub. The second differential oxidation prevents arsenic from channeling in the n-gates and reduces boron counter doping in the p-channel gates.

Figure 5:
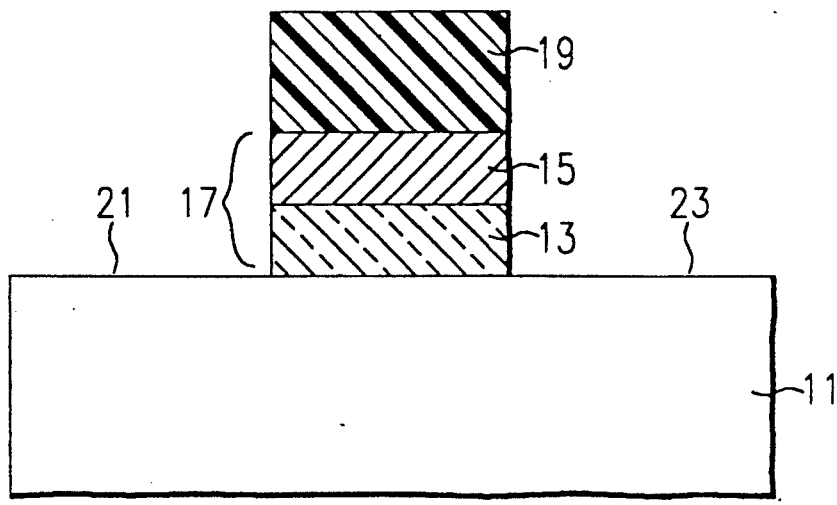

Another embodiment of the present invention is depicted in FIG. 5 which illustrates a portion of a partially fabricated integrated circuit. Substrate 11 may be silicon or epitaxial silicon of either n or p type or intrinsic silicon. Gate stack 17 having gate oxide 13 and overlying conductor 15 may be formed by conventional techniques which may involve deposition and subsequent patterning of blanket layers of oxide and conductive material, respectively. Typically, conductor 15 is polysilicon. Reference numeral 19 denotes the photoresist which remains upon gate stack 17 after the unwanted portions of the oxide and polysilicon layers have been etched away.

Typical thicknesses for layers 13 and 15 are 150 Å and 380 Å, respectively. Photoresist 19 is typically between 3000 Å and 7000 Å after gate stack 17 has been defined.

In typical semiconductor processing, the next major steps are the removal of photoresist 19 and subsequent direction of an ion implantation beam at silicon surfaces 21 and 23 to form source and drain regions, with gate stack 17 serving as a self-aligned mask. However, as noted before, if the thickness of gate stack 17 is not sufficiently great relative to the energy and direction of the impinging incident ions, there is a danger that channeling may occur with its attendant degradation of transistor performance.

In this particular illustrative embodiment of the present invention, photoresist 19 is *not* removed prior to ion implantation. Instead, photoresist 19 is permitted to remain in place as a protective shield for gate stack 17 while the ion implantation beam is directed at substrate 11, forming source and drain regions beneath surfaces 21 and 23.

Because ion implantation beams are often directed at a slight angle (approximately 7°) towards silicon surfaces 21 and 23, it may be necessary to reduce the thickness of photoresist 19 to 2000-3000 Å by dry etching to reduce shadowing. After the implantation is performed, photoresist 19 may be removed.

Another embodiment of the present invention includes formation of a silicon nitride/silicon dioxide layer on top of the gate stack before it is patterned. A nitride layer between 380 Å and 1800 Å will help to protect the gate stack during implantation. The nitride layer is formed on top of a thin (approximately 200 Å or so) layer of oxide which promotes adhesion to the polysilicon. The nitride/oxide may be subsequently etched away, if desired.

What is claimed is:

1. A method of semiconductor fabrication comprising:
   forming a gate stack upon a substrate;
   forming a first oxide layer upon said gate stack and upon said substrate, the thickness of said first oxide layer upon said substrate being less than the thickness of said first oxide layer upon said gate stack;
   implanting a dopant species through said first oxide layer into said substrate;
   heating said substrate to diffuse said dopant species and to thicken said first oxide layer;
   forming spacers adjacent said gate stack by anisotropic etching, said etching also removing a portion of said first oxide layer contacting said substrate;
   forming a second oxide layer by differential oxidation, the thickness of said second oxide layer upon said substrate being less than the thickness of said second oxide layer upon said gate stack;
   implanting a dopant species through said second oxide layer into said substrate.

2. A method of semiconductor fabrication comprising:
   forming at least two moats upon a substrate, a first moat for an n-tub and a second moat for a p-tub;
   forming at least one gate stack within each moat;
   forming a first oxide layer by differential oxidation upon each said gate stack and upon said substrate within each moat, said first oxide layer having a thickness over said gate stacks which is greater than its thickness over said substrate;
   performing a blanket n-type implant over both exposed moats;
   covering said p-tub with first photoresist;
   performing a blanket p-type implant;
   removing said first photoresist;
   forming spacers adjacent said gate in said p-tub and said n-tub;
   forming a second oxide layer by differential oxidation upon each gate stack and upon said substrate within each moat, said second oxide layer having a thickness over said gate stacks which is greater than its thickness over said substrate;
   covering said n-tub with second photoresist;
   performing a blanket n-type implant;
   removing said second photoresist;
   covering said p-tub with third photoresist;
   performing a blanket p-type implant;
   removing said third photoresist.

* * * * *